United States Patent
Zhao et al.

(10) Patent No.: US 11,634,327 B2
(45) Date of Patent: Apr. 25, 2023

(54) SP2-SP3 HYBRID CRYSTALLINE CARBON AND ITS PREPARATION PROCESS

(71) Applicant: YANSHAN UNIVERSITY, Qinhuangdao (CN)

(72) Inventors: Zhisheng Zhao, Qinhuangdao (CN); Kun Luo, Qinhuangdao (CN); Bing Liu, Qinhuangdao (CN); Wentao Hu, Qinhuangdao (CN); Lei Sun, Qinhuangdao (CN); Julong He, Qinhuangdao (CN); Dongli Yu, Qinhuangdao (CN); Yongjun Tian, Qinhuangdao (CN); Bo Xu, Qinhuangdao (CN); Zhongyuan Liu, Qinhuangdao (CN)

(73) Assignee: YANSHAN UNIVERSITY, Qinhuangdao (CN)

( * ) Notice: Subject to any disclaimer, the term of this patent is extended or adjusted under 35 U.S.C. 154(b) by 429 days.

(21) Appl. No.: 16/831,327

(22) Filed: Mar. 26, 2020

(65) Prior Publication Data

US 2021/0039950 A1 Feb. 11, 2021

(30) Foreign Application Priority Data

Aug. 5, 2019 (CN) .......................... 201910717722.1

(51) Int. Cl.
*C01B 32/05* (2017.01)
*B24D 3/00* (2006.01)
*H01L 29/16* (2006.01)

(52) U.S. Cl.
CPC ................ *C01B 32/05* (2017.08); *B24D 3/00* (2013.01); *H01L 29/1602* (2013.01);
(Continued)

(58) Field of Classification Search
CPC ...................................................... C01B 32/05
See application file for complete search history.

(56) References Cited

U.S. PATENT DOCUMENTS 8,318,268 B2 * 11/2012 Lee .......................... B01J 3/006
427/577

FOREIGN PATENT DOCUMENTS

CN 102203374 A 9/2011
CN 109573979 A 4/2019
(Continued)

OTHER PUBLICATIONS

Extended European Search Report for European Patent Application No. 20165872.1, dated Jun. 25, 2020.
(Continued)

*Primary Examiner* — Stuart L Hendrickson
(74) *Attorney, Agent, or Firm* — Maschoff Brennan; Brent A. Johnson; Yuefen Zhou

(57) ABSTRACT

The present disclosure belongs to the technical filed of new carbon materials and relates to a novel $sp^2$-$sp^3$ hybrid crystalline carbon named Gradia and its preparation process. A novel $sp^2$-$sp^3$ hybrid carbon named Gradia is synthesized using $sp^2$ hybrid carbon as raw materials under high temperature and high pressure. The basic structural units of Gradia are composed of $sp^2$ hybrid graphite-like structural units and $sp^3$ hybrid diamond-like structural units. Gradia disclosed in the present disclosure is a class of new $sp^2$-$sp^3$ hybrid carbon allotrope, whose crystal structure can vary with the widths and/or crystallographic orientation relationships of internal $sp^2$ and/or $sp^3$ structural units.

15 Claims, 6 Drawing Sheets

(52) U.S. Cl.
CPC ...... *C01P 2002/74* (2013.01); *C01P 2002/77* (2013.01); *C01P 2002/82* (2013.01); *C01P 2004/04* (2013.01)

(56) References Cited

FOREIGN PATENT DOCUMENTS

| | | |
|---|---|---|
| CN | 109701447 A | 5/2019 |
| CN | 109821480 A | 5/2019 |
| JP | S57170812 A | 10/1982 |
| JP | 2012121767 A | 6/2012 |
| JP | 2016087481 A | 5/2016 |
| JP | 2018513823 A | 5/2018 |
| WO | 2016134108 A1 | 8/2016 |

OTHER PUBLICATIONS

The Second Office Action issued by the China National Intellectual Property Administration (CNIPA) dated Dec. 1, 2021 for the Chinese Patent Application No. 201910717722.1.
The Rejection Decision issued by the China National Intellectual Property Administration (CNIPA) dated Mar. 2, 2022 for the Chinese Patent Application No. 201910717722.1.
The First Office Action issued by the China National Intellectual Property Administration (CNIPA) dated Aug. 30, 2021 for the Chinese Patent Application No. 201910717722.1.
The First Office Action issued by the Japanese Patent Office dated Oct. 4, 2022 for the Japanese Patent Application No. 2020-072447.

\* cited by examiner

SP2-SP3 HYBRID CRYSTALLINE CARBON AND ITS PREPARATION PROCESS

CROSS-REFERENCE TO RELATED APPLICATION

This application claims priority to Chinese Patent Application No. 201910717722.1, filed on Aug. 5, 2019, which is hereby incorporated by reference in its entirety.

TECHNICAL FIELD

The present disclosure belongs to the technical field of carbon materials and relates to a novel carbon allotrope and its preparation process.

BACKGROUND

Carbon has a variety of allotropes, and the discovery of every allotrope has greatly promoted the development of science and technology as well as social progress. These carbon allotropes include diamond, fullerene, carbon nanotubes, graphene, carbine carbon, and graphyne, among which the discoverers of fullerene and graphene won the Nobel Prize in Chemistry in 1996 and the Nobel Prize in Physics in 2010, respectively. Over the past hundred years, people never desisted from working hard to explore new carbon allotropes.

The phenomenon of multiple allotropes of carbon originates from its three hybridization modes of sp, $sp^2$ and $sp^3$. The sp hybridization refers to a hybridization mode that occurs between one 2s orbital and one 2p orbital within the same atom. The $sp^2$ hybridization refers to a hybridization mode that occurs among one 2s orbital and two 2p orbitals within the same electron layer of an atom. The $sp^3$ hybridization refers to a hybridization mode that occurs among one 2s orbital and three 2p orbitals within the same electron layer of an atom. Different hybridization modes often show distinct physical and chemical properties. For example, graphite consisting of $sp^2$ carbon atoms is very soft and has good conductivity, while diamond consisting of $sp^3$ carbon atoms is the hardest insulator in nature. Therefore, it is desirable to develop a carbon configuration having two or more hybridization modes, which is expected to exhibit characteristics of different hybridization modes and to form a carbon material with a novel function combination. For example, diamond-like carbon (DLC) film obtained by means of deposition is an $sp^2$-$sp^3$ hybrid amorphous carbon material (Robertson J. Diamond-like amorphous carbon Materials Science & Engineering R Reports, 2002, 37 (4): 129-281); a series of $sp^2$-$sp^3$ hybrid compressed glassy carbon materials with excellent properties (Hu M, He J, Zhao Z, et al. Compressed glassy carbon: An ultrastrong and elastic interpenetrating graphene network [J]. Science Advances, 2017, 3 (6): e1603213) and a highly $sp^3$ hybridized "amorphous diamond" material (Zeng Z, Yang L, Zeng Q, et al. Synthesis of quenchable amorphous diamond [J]. Nature Communications, 2017, 8 (1): 322) were synthesized using glassy carbon as raw material under high temperature and high pressure; and $sp^2$-$sp^3$ hybrid 1D-$C_{60}$, 2D-$C_{60}$, 3D-$C_{60}$ polymers and amorphous carbons were prepared from $C_{60}$ under high temperature and high pressure (Blank V D, Buga S G, Dubitsky G A, et al. High-pressure polymerized phases of $C_{60}$ Carbon, 1998, 36 (4): 319-343). It is worth noting that among these $sp^2$-$sp^3$ hybrid carbon materials reported in the current literatures and patents, only 1D-$C_{60}$, 2D-$C_{60}$, and 3D-Coo polymers are crystalline carbons, and the others are amorphous carbons.

In addition, some purely theoretically predicted $sp^2$-$sp^3$ hybrid crystalline carbon allotropes have been reported in the literature (Hu M, Ma M, Zhao Z, et al. Superhard $sp^2$-$sp^3$ hybrid carbon allotropes with tunable electronic properties [J]. AIP Advances, 2016, 6 (5): 237), and their optical, electrical, and mechanical properties were theoretically calculated. However, these conjectural $sp^2$-$sp^3$ hybrid crystalline carbons have not been experimentally confirmed yet.

SUMMARY

An object of the present disclosure is to provide a new $sp^2$-$sp^3$ hybrid crystalline carbon and its preparation process.

In one aspect, the present disclosure provides an $sp^2$-$sp^3$ hybrid crystalline carbon allotrope, preferably with a space group of 10 (P2/m) or 11 (P2$_1$/m) or 12 (C2/m), wherein its basic structural unit is composed of $sp^2$ hybrid graphite-like structural unit and $sp^3$ hybrid diamond-like structural unit. In the context of the present disclosure, such an $sp^2$-$sp^3$ hybrid crystalline carbon is also named "Gradia", which name is taken from the first three letters of graphite and the first three letters of diamond.

In another aspect, the present disclosure provides a process for the preparation of the $sp^2$-$sp^3$ hybrid crystalline carbon allotrope, i.e. Gradia, comprising the steps of:

(1) Loading raw carbon materials, preferably $sp^2$ hybrid carbon materials, into a pre-pressing mold, pre-forming the raw carbon materials into a body by using a press, and then placing it in a vacuum hot-pressing sintering furnace for pre-sintering;

(2) Putting the pre-sintered carbon raw material body as obtained in step (1) into an assembly block, and then putting the assembly block containing the carbon raw material body into a drying box for drying;

(3) Removing the assembly block as obtained in step (2) from the drying box and cooling it (preferably to the room temperature), placing it in a press for high temperature and high pressure treatment, and then carrying out pressure relief operation after cooling;

(4) Removing the assembly block from the press to obtain the $sp^2$-$sp^3$ hybrid crystalline carbon allotrope.

With the above technical solutions, the following technical effects may be achieved:

The present disclosure may make use of ordinary or commercially available $sp^2$ hybrid carbon materials as raw materials, and has less requirements for size and purity of the raw materials. As the present disclosure has no special requirements for purity of the $sp^2$ carbon raw materials used, the $sp^2$ carbon materials may comprise other elements than carbon element (C) as long as they contain a certain proportion of $sp^2$ hybrid carbon atoms and the impurities do not affect the structure of Gradia. The impurity element may be silicon (Si), oxygen (O), nitrogen (N), hydrogen (H), and the like. The raw materials as used are cheap and easily available.

A novel $sp^2$-$sp^3$ hybrid crystalline carbon, i.e. Gradia, is prepared by the preparation process of the present disclosure. The novel $sp^2$-$sp^3$ hybrid crystalline carbon has a crystal structure distinct from other crystalline carbons, its basic structural units are composed of $sp^2$ hybrid graphite-like structural units and $sp^3$ hybrid diamond-like structural units, and thus it exhibits various properties. For example, Gradia is an ultra-hard semiconducting material. In addition, the crystal structure of the novel $sp^2$-$sp^3$ hybrid carbon can vary with the widths and/or crystallographic orientation relationships of internal $sp^2$ and $sp^3$ structural units, which can be controlled by e.g. adjusting the synthesis pressure and temperature. Therefore, it is possible to adjust the physical properties such as optical, electrical, and mechanical properties of this type of hybrid carbon materials and to apply them in various fields with broad prospects. For example, because Gradia is a super hard carbon material, it can be used to prepare cutting tools or grinding tools. Therefore, the present disclosure also provides a cutting tool or grinding tool, comprising Gradia. In addition, because Gradia is a semiconductor material and its conductivity can be adjusted as needed, it can be used as a basic material for the preparation of semiconductor devices. Therefore, the invention also provides a semiconductor device comprising Gradia.

The $sp^2$-$sp^3$ hybrid crystalline carbon, i.e. Gradia, as prepared in accordance with the present disclosure has a density lower than diamond. Therefore, the volume shrinkage during the high-pressure phase transition process is relatively small, which is beneficial for the formation of a bulk material with good formability.

The high-temperature high-pressure equipment used in present disclosure is currently widely used, and has the advantages of simplicity of operation and ease of controlling synthesis parameters. At the same time, the raw materials used are abundant and inexpensive. Thus, the present $sp^2$-$sp^3$ hybrid crystalline carbon materials may be produced in an industrial scale and their crystal structures can be adjusted to achieve regulation of performances.

DRAWINGS

DETAILED DESCRIPTION

Figure 1:
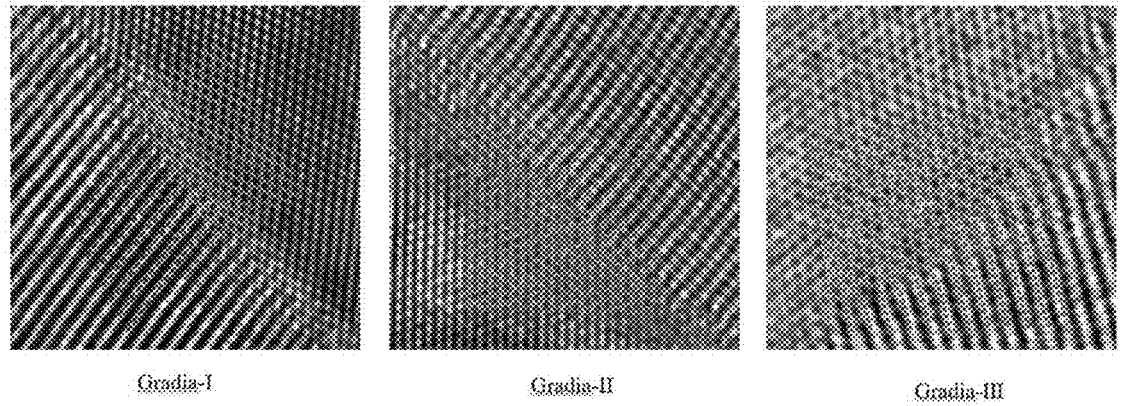
FIG. 1 is the high-resolution TEM images of three types of Gradia, a novel $sp^2$-$sp^3$ hybrid crystalline carbon allotrope in the present disclosure.

The present disclosure will be further described in detail below with reference to the drawings and specific embodiments.

As used herein, the articles "a", "an" and "the" may include plural referents unless otherwise expressly limited to one-referent, or if it would be obvious to a skilled artisan from the context of the sentence that the article referred to a singular referent.

Where a numerical range is disclosed herein, then such a range is continuous, inclusive of both the minimum and maximum values of the range, as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all subranges subsumed therein. For example, a stated range of from "1 to 10" should be considered to include any and all subranges between the minimum value of 1 and the maximum value of 10. In addition, every point or individual value disclosed herein value may serve as a lower or upper limit combined with any other point or individual value or any other lower or upper limit disclosed herein, to form a range not explicitly recited herein, which range will be covered by the protection scope of the attached claims.

The present disclosure provides an $sp^2$-$sp^3$ hybrid crystalline carbon allotrope (named Gradia), preferably with a space group of 10 (P2/m) or 11 (P2$_1$/m) or 12 (C2/m), wherein its basic structural unit is composed of $sp^2$ hybrid graphite-like structural unit and $sp^3$ hybrid diamond-like structural unit.

The Gradia disclosed in the present disclosure refers to a novel $sp^2$-$sp^3$ hybrid carbon allotrope, which is completely different from other carbon materials in terms of its crystal structure, and is composed of $sp^2$ hybrid graphite-like structural unit and $sp^3$ hybrid diamond-like structural unit. Its crystal structure may vary with the widths and/or crystallographic orientation relationships of the internal $sp^2$ and/or $sp^3$ structural units.

The present further disclosure provides a process for the preparation of the $sp^2$-$sp^3$ hybrid crystalline carbon allotrope, comprising the steps of:

(1) Loading raw carbon materials into a pre-pressing mold, pre-forming the raw carbon materials into a body by using a press, and then placing it in a vacuum hot-pressing sintering furnace for pre-sintering;

(2) Putting the pre-sintered carbon raw material body as obtained in step (1) into an assembly block, and then putting the assembly block containing the carbon raw material body into a drying box for drying;

(3) Removing the assembly block as obtained in step (2) from the drying box and cooling it (preferably to the room temperature), placing it in a press for high temperature and high pressure treatment, and then carrying out pressure relief operation after cooling;

(4) Removing the assembly block from the press to obtain the $sp^2$-$sp^3$ hybrid crystalline carbon allotrope (as a block sample).

In a preferred embodiment, the raw carbon materials comprise any one or several $sp^2$ hybrid carbon materials such as graphite, fullerene, graphene, carbon nanotubes, glassy carbon, amorphous carbon, onion carbon, carbon black, carbine carbon, graphyne, DLC and other carbon materials containing $sp^2$ hybridization. Preferably, graphite, fullerene, graphene, and/or carbon nanotubes are used as the raw materials.

In addition, it is desirable to wash the raw materials with an acid solution to remove the impurities present therein, such as silicon (Si), oxygen (O), iron (Fe), aluminum (Al), nitrogen (N), hydrogen (H), and the like, as to achieve Gradia products with superior properties. The washed materials need to be cleaned (e.g. with deionized water) and dried before being loaded into the pre-pressing mold.

In a preferred embodiment, the pre-sintering step of step (1) is carried out at a temperature of 400-1800° C. for a period of 10-60 minutes.

In a preferred embodiment, the pre-formed body of step (1) is a cylinder.

In a preferred embodiment, the drying step of step (2) is carried out at a temperature of 100-250° C. for 1-3 h.

In a preferred embodiment, the high temperature and high pressure treatment of step (3) is carried out at a pressure of 5-25 GPa and a temperature of 25-2500° C. for a holding period of 5-120 minutes, in an apparatus e.g. (but not limited to) T25 type press supplied by Rockland Research (USA).

In a preferred embodiment, the novel $sp^2$-$sp^3$ hybrid crystalline carbon material synthesized by the above preparation process has a crystal structure that can be adjusted with the changes of the internal $sp^2$-hybrid graphite-like structural unit and $sp^3$-hybrid diamond-like structural unit. In particular, the crystal structure of the novel $sp^2$-$sp^3$ hybrid carbon can vary with the widths and/or crystallographic orientation relationships of internal $sp^2$ and $sp^3$ structural units, which can be controlled by e.g. adjusting the synthesis pressure and temperature used in the preparation process.

In a particularly preferred embodiment, the present disclosure discloses a process for preparing a novel $sp^2$-$sp^3$ hybrid crystalline carbon named Gradia, comprising the following steps:

(1) loading raw $sp^2$ hybrid carbon materials comprising graphite, fullerene, carbon nanotubes, amorphous carbon, or onion carbon into a pre-pressing mold, pre-forming the raw $sp^2$ hybrid carbon materials into a cylinder raw material body by using a press, and then placing it in a vacuum hot-pressing sintering furnace for pre-sintering wherein the pre-sintering is carried out at a temperature of 400-1800° C. and a pressure e.g. 30-50 MPa for a period of 10-60 min;

(2) Putting the pre-sintered $sp^2$ hybrid carbon raw material body as obtained in step (1) into an assembly block, and then putting the assembly block containing the $sp^2$ hybrid carbon raw material body into a drying box for drying wherein the drying is carried out at a temperature of 100-250° C. for 1-3 h;

(3) Removing assembly block as obtained in step (2) from the drying box and cooling it to room temperature, then placing it in a T25 type press supplied by Rockland Research, the USA for high temperature and high pressure treatment, wherein the high temperature and high pressure treatment is carried out at a pressure of 1-25 GPa and a temperature of 25-2500° C. for a holding period of 5-120 min and then carrying out pressure relief operation after cooling;

(4) Removing the assembly block from the press (and disassembling the assembly block surrounding the sintered body sample) to obtain a novel $sp^2$-$sp^3$ hybrid crystalline carbon, i.e. Gradia.

Figure 2:
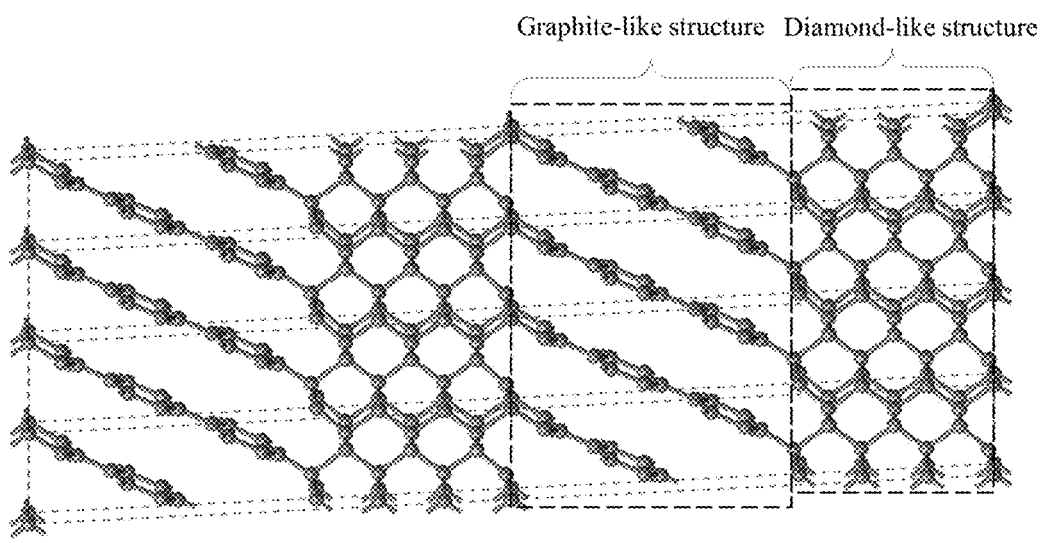
FIG. 2 is the crystal structure diagram of Gradia-I containing 24 carbon atoms in the unit cell, according to the present disclosure.
Figure 4:
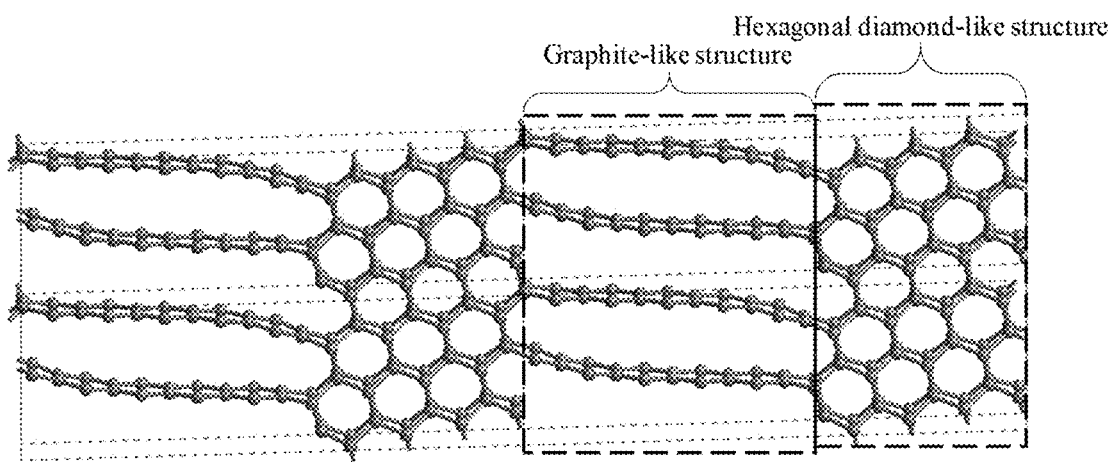
FIG. 4 is the crystal structure diagram of Gradia-III containing 88 carbon atoms in the unit cell, according to the present disclosure.
Figure 5:
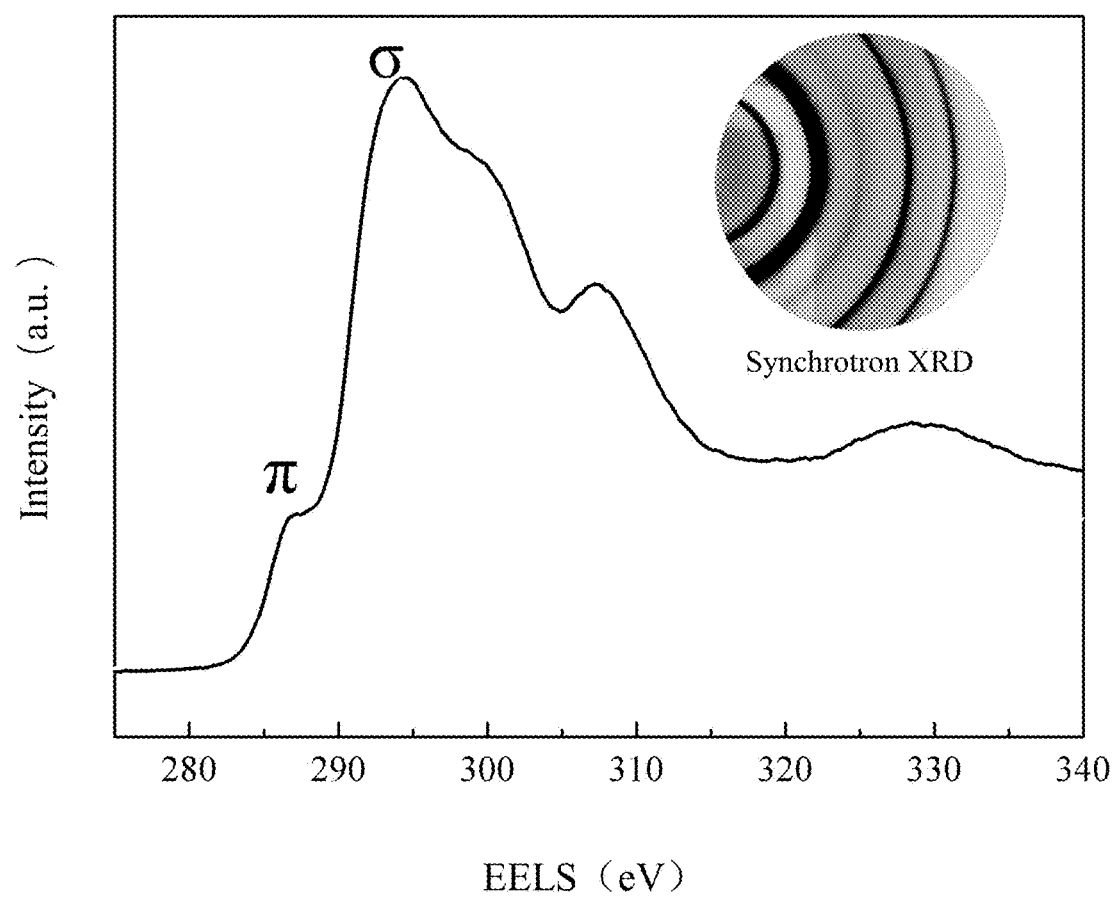
FIG. 5 is an electron energy loss spectrum (EELS) and a synchrotron X-ray diffraction (XRD) pattern of Gradia, a novel $sp^2$-$sp^3$ hybrid crystalline carbon allotrope prepared in accordance with one embodiment of the present disclosure, as measured by Themis Z transmission electron microscope and synchrotron radiation X-ray diffraction.
Figure 6:
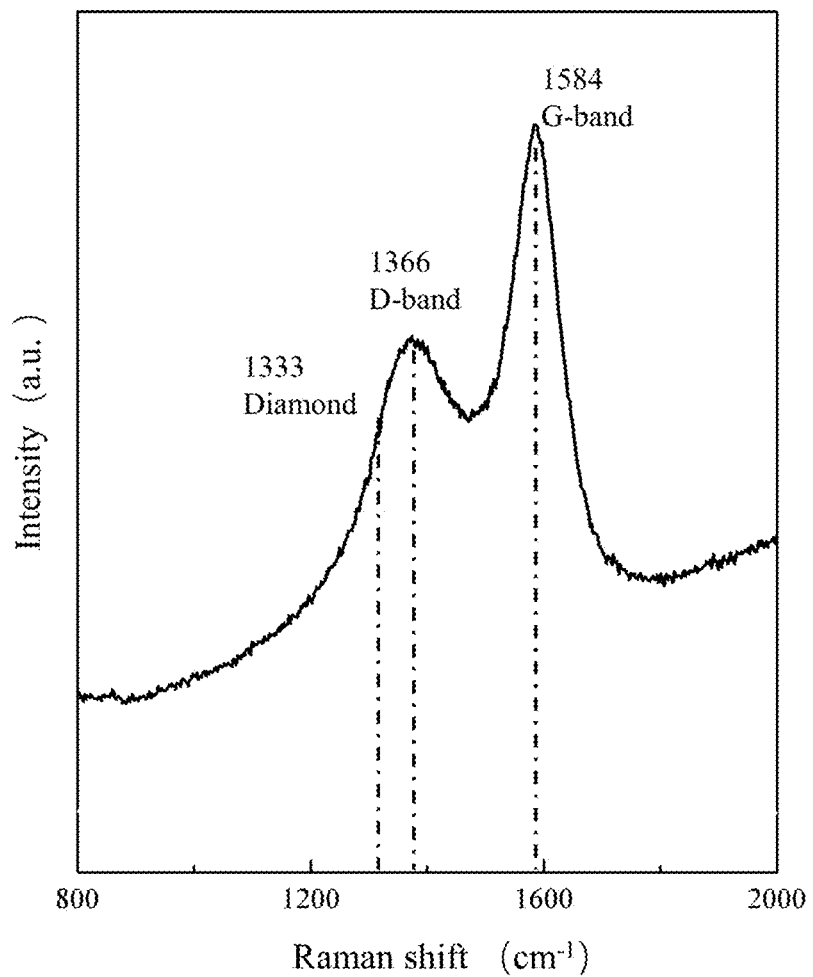
FIG. 6 is a Raman spectrum of Gradia, a novel $sp^2$-$sp^3$ hybrid crystalline carbon allotrope prepared in accordance with one embodiment of the present disclosure, as measured by Raman spectrometer.

The $sp^2$-$sp^3$ hybrid crystal carbon materials as obtained in embodiments of the present invention, named Gradia, have been analyzed through hard X-ray micro-focusing beamline (BL15U1) of Shanghai Synchrotron Radiation Facility (SSRF), LabRAM HREvolution Raman spectrometer from Horiba JY, France, and Themis Z transmission electron microscope, and the obtained spectra are shown in FIG. 1, FIG. 5 and FIG. 6. As seen from FIGS. 1, 5 and 6, the novel $sp^2$-$sp^3$ hybrid crystalline carbon prepared is composed of $sp^2$-hybrid graphite-like structural unit and $sp^3$-hybrid diamond-like structural unit, and thus is named Gradia, as explained above. Through observation by Themis Z transmission electron microscope, it is found that the novel $sp^2$-$sp^3$ hybrid crystalline carbon named Gradia has varied crystal structures (FIG. 1), based on the widths and/or crystallographic orientation relationships of the internal $sp^2$-hybrid graphite-like structural unit and/or $sp^3$-hybrid diamond-like structural unit. In particular, Gradia as prepared according to the present invention may be a monocrystal or a polycrystal composed of phases of different monocrystals. It has been found that, Gradia may have three monoclinic crystal structures as shown in FIGS. 2-4, named Gradia-I, Gradia-II, and Gradia-III, respectively.

Based on the widths of the internal $sp^2$-hybrid graphite-like structural unit and/or $sp^3$-hybrid diamond-like structural unit, there are three different space group in Gradia-I: 10 (P2/m) or 11 (P2$_1$/m) or 12 (C2/m). The Gradia-I with space group of 11 (P2$_1$/m) is shown in FIG. 2. Taking a crystal structure with unit cell of 24 carbon atoms as an example, its lattice constants are a=3.5357 Å, b=2.4740 Å, c=18.5459 Å, β=87.052°. As seen from FIG. 2, Gradia-I is a novel $sp^2$-$sp^3$ hybrid crystalline carbon formed by graphite-like structural unit (left part) and diamond-like structural unit (right part) connected with a specific coherent plane, showing the characteristics in FIG. 2. Carbon with this type of coherent plane belongs to Gradia-I (with space group of 10 (P2/m) or 11 (P2$_1$/m) or 12 (C2/m)).

Figure 3:
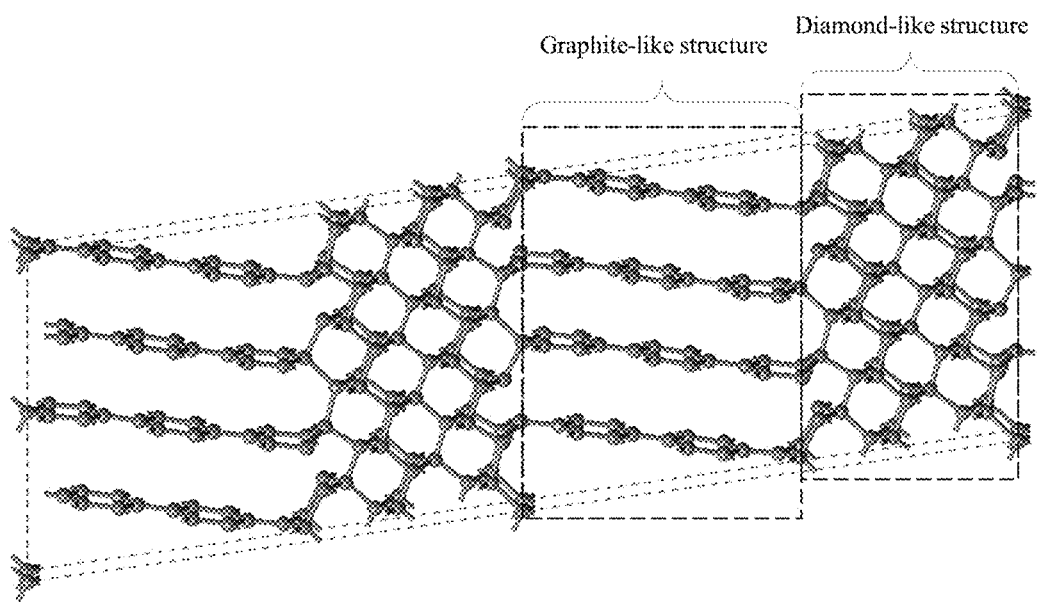
FIG. 3 is the crystal structure diagram of Gradia-II containing 88 carbon atoms in the unit cell, according to the present disclosure.

The space group of Gradia-II is 12 (C2/m), as shown in FIG. 3. Taking a crystal structure with unit cell of 88 carbon atoms as an example, its lattice constants are a=12.5999 Å, b=2.4755 Å, c=18.9818 Å, β=81.787°. As seen from FIG. 3, Gradia-II carbon is a novel $sp^2$-$sp^3$ hybrid crystalline carbon formed by graphite-like structural unit (left part) and diamond-like structural unit (right part) with a specific coherent plane, showing the characteristics in FIG. 3. Carbon with this type of coherent plane belongs to Gradia-II with space group of 12 (C2/m).

The space group of Gradia-III is 11 (P2$_1$/m), as shown in FIG. 4. Taking a crystal structure with unit cell of 88 carbon atoms as an example, its lattice constants are a=6.6401 Å, b=4.1815 Å, c=21.9983 Å, β=88.249°. As seen from FIG. 4, Gradia-III is a novel $sp^2$-$sp^3$ hybrid crystalline carbon formed by graphite-like structural unit (left part) and hexagonal diamond-like structural unit (right part) with a specific coherent plane, which shows the characteristics in FIG. 4. Carbon with this type of coherent plane belongs to Gradia-III with space group of 11 (P2$_1$/m).

Therefore, Gradia as prepared according to the present invention may be a monocrystal with a space group of 10 (P2/m) or 11 (P2$_1$/m) or 12 (C2/m) or a polycrystal composed of two or more different phases, each of which phases having a space group of 10 (P2/m) or 11 (P2$_1$/m) or 12 (C2/m).

EXAMPLES

The raw materials used in the examples were all commercially available $sp^2$ hybrid carbon materials, including graphite, fullerene, graphene, carbon nanotubes, glassy carbon, amorphous carbon, onion carbon, carbon black, carbine carbon, graphyne, DLC and other carbon materials containing $sp^2$ hybridization.

For the high temperature and high pressure treatments in examples, a T25 type press supplied by Rockland Research (USA) was used, and the synthesis pressure and temperature ranges were 1-25 GPa and 25-2500° C., respectively. However, it should be noted that high temperature and high pressure equipment involved in the present disclosure is not limited to the T25 type press, and other high-pressure equipment capable of achieving the corresponding pressure and temperature conditions are likewise suitable for the preparation of Gradia.

Example 1: Preparation of Gradia Using $sp^2$ Hybrid Graphite as Raw Carbon Material (1) Graphite was loaded into a pre-pressing mold, and the pre-pressing process was carried out at a pressure of 20-40 MPa using a press and held for 5-10 minutes to obtain a cylinder body. Then, it was placed into a vacuum hot-pressing sintering furnace for pre-sintering, wherein the pre-sintering temperature was controlled within the range of 1000-1600° C. and the pre-sintering time was controlled within the range of 20-40 min.

(2) The pre-sintered $sp^2$ hybrid carbon raw material body as obtained in step (1) was put into an assembly block, and then the assembly block containing the $sp^2$ hybrid carbon raw material body was put into a drying box for drying wherein the drying temperature was 180° C. and the drying time was 2 h.

(3) The assembly block as obtained in step (2) was removed from the drying box and cooled to room temperature, and then was placed into a T25 type press supplied by Rockland Research (USA) for high temperature and high pressure treatment, wherein the synthesis pressure was 5-25 GPa, the synthesis temperature was 600-2500° C. and the holding time was 10-120 min, and then the pressure was relieved after cooling.

(4) The assembly block was removed from the press, thereby a novel $sp^2$-$sp^3$ hybrid crystalline carbon, i.e. Gradia, was obtained.

The resulting product was measured and analyzed. The obtained novel $sp^2$-$sp^3$ hybrid crystalline carbon, i.e. Gradia, was analyzed through hard X-ray micro-focusing beamline (BL15U1) from Shanghai Synchrotron Radiation Facility (SSRF), LabRAM HREvolution Raman spectrometer from Horiba JY, France, and Themis Z transmission electron microscope. The high resolution transmission electron microscopy and synchrotron XRD result demonstrated that the synthesized Gradia is a carbon form of novel structure; and the results from EELS and Raman spectra demonstrated that it is an $sp^2$-$sp^3$ hybrid carbon.

Example 2: Preparation of Gradia Using $sp^2$ Hybrid Carbon Nanotubes as Raw Carbon Materials (1) Carbon nanotubes were loaded into a pre-pressing mold, and the pre-pressing process was carried out at a pressure of 30-50 MPa using a press, and held for 5-10 minutes to obtain a cylinder body. Then, it was placed into a vacuum hot-pressing sintering furnace for pre-sintering, wherein the pre-sintering temperature was controlled within the range of 800-1600° C. and the pre-sintering time was controlled within the range of 15-40 min.

(2) The pre-sintered $sp^2$ hybrid carbon raw material body as obtained in step (1) was put into an assembly block, and then the assembly block containing the carbon nanotube body was put into a drying box for drying wherein the drying temperature was 180° C. and the drying time was 2 h.

(3) The assembly block as obtained in step (2) was removed from the drying box and cooled to room temperature, and then was placed into a T25 type press supplied by Rockland Research, USA for high temperature and high pressure treatment, wherein the synthesis pressure was 7-25 GPa, the synthesis temperature was 1000-1800° C. and the holding time was 15-60 min, and then the pressure was relieved after cooling.

(4) The assembly block was removed from the press, thereby a novel $sp^2$-$sp^3$ hybrid crystalline carbon, i.e. Gradia, was obtained.

The resulting product was measured and analyzed. The obtained novel $sp^2$-$sp^3$ hybrid crystalline carbon, i.e. Gradia, was analyzed through hard X-ray micro-focusing beamline (BL15U1) from Shanghai Synchrotron Radiation Facility (SSRF), LabRAM HREvolution Raman spectrometer from Horiba JY, France, and Themis Z transmission electron microscope. The high resolution transmission electron microscopy and synchrotron XRD result demonstrated that the synthesized Gradia is a carbon form of new structure; and the results from EELS and Raman spectra demonstrated that it is an $sp^2$-$sp^3$ hybrid carbon.

Example 3: Preparation of Gradia Using $sp^2$ Hybrid Fullerene as Raw Carbon Materials (1) Fullerene was loaded into a pre-pressing mold, and the pre-pressing process was carried out at a pressure of 20-50 MPa using a press, and held for 5-15 minutes to obtain a cylinder body.

(2) The pre-pressed fullerene body as obtained in step (1) was put into an assembly block, and then the assembly block containing fullerene body was put into a drying box for drying, wherein the drying temperature was 180° C. and the drying time was 2 h.

(3) The assembly block as obtained in step (2) was removed from the drying box and cooled to room temperature, and then was placed into a T25 type press supplied by Rockland Research, USA for high temperature and high pressure treatment, wherein the synthesis pressure was 10-18 GPa, the synthesis temperature was 600-1500° C. and the holding time was 30-120 min, and then the pressure was relieved after cooling.

(4) The assembly block was removed from the press, thereby a novel $sp^2$-$sp^3$ hybrid crystalline carbon, i.e. Gradia, was obtained.

The resulting product was measured and analyzed. The obtained novel $sp^2$-$sp^3$ hybrid crystalline carbon, i.e. Gradia, was analyzed through hard X-ray micro-focusing beamline (BL15U1) from Shanghai Synchrotron Radiation Facility (SSRF), LabRAM HREvolution Raman spectrometer from Horiba JY, France, and Themis Z transmission electron microscope. The high resolution transmission electron microscopy and synchrotron XRD result demonstrated that the synthesized Gradia is a carbon form of new structure; and the results from EELS and Raman spectra demonstrated that it is an $sp^2$-$sp^3$ hybrid carbon.

Example 4: Preparation of Gradia Using $sp^2$ Hybrid Graphite as Raw Carbon Material (1) Graphite was put into dilute hydrochloric acid solution to remove impurities. After the graphite was removed from the acid solution, it was rinsed by deionized water and then dried, affording the purified raw material. Then, the raw material was loaded into a pre-pressing mold, and the pre-pressing process was carried out at a pressure of 20 MPa using a press and held for 5 minutes to obtain a cylinder body. Then, it was placed into a vacuum hot-pressing sintering furnace for pre-sintering, wherein the pre-sintering pressure was set to 30 MPa, the pre-sintering temperature was set to 1200° C. and the pre-sintering time was 20 min.

(2) The pre-sintered graphite body as obtained in step (1) was put into an assembly block, and then the assembly block containing the graphite body was put into a drying box for drying wherein the drying temperature was 180° C. and the drying time was 2 h.

(3) The assembly block as obtained in step (2) was removed from the drying box and cooled to room temperature, and then was placed into a T25 type press supplied by Rockland Research (USA) for high temperature and high pressure treatment, wherein the synthesis pressure was 15 GPa, the synthesis temperature was 1400° C. and the holding time was 60 min, and then the pressure was relieved after cooling.

(4) The assembly block was removed from the press, whereby Gradia was obtained. The Gradia as obtained was polished using a diamond paste.

The resulting product was measured and analyzed through hard X-ray micro-focusing beamline (BL15U1) from Shanghai Synchrotron Radiation Facility (SSRF), LabRAM HREvolution Raman spectrometer from Horiba JY, France, and Themis Z transmission electron microscope. The measurement results are shown in FIGS. 5 and 6. The synchrotron XRD result (FIG. 5) demonstrates that the synthesized Gradia is a carbon allotrope having a new structure; and the results from EELS (FIG. 5) and Raman spectra (FIG. 6) demonstrate that it is an $sp^2$-$sp^3$ hybrid carbon. Crystallographic analysis shows that the Gradia sample as obtained is a polycrystal composed of Gradia-I (with a space group of 11), Gradia-II (with a space group of 12) and Gradia-III (with a space group of 11).

Figure 7:
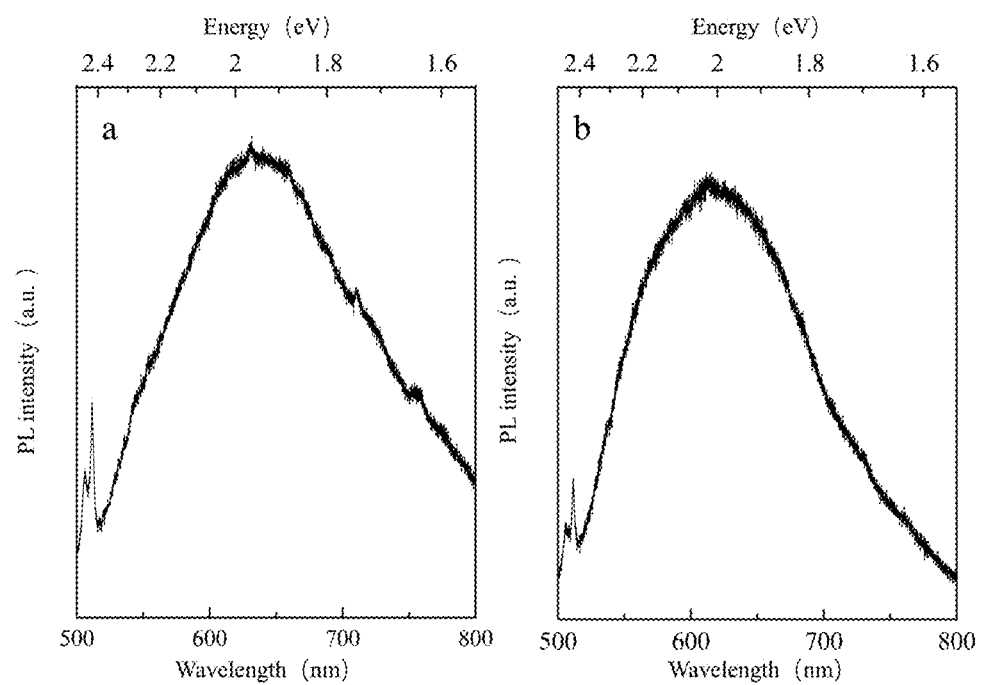
FIG. 7 is photoluminescence (PL) spectra of Gradia samples prepared in accordance with Examples 4 and 5, as measured by Raman spectrometer.
Figure 8:
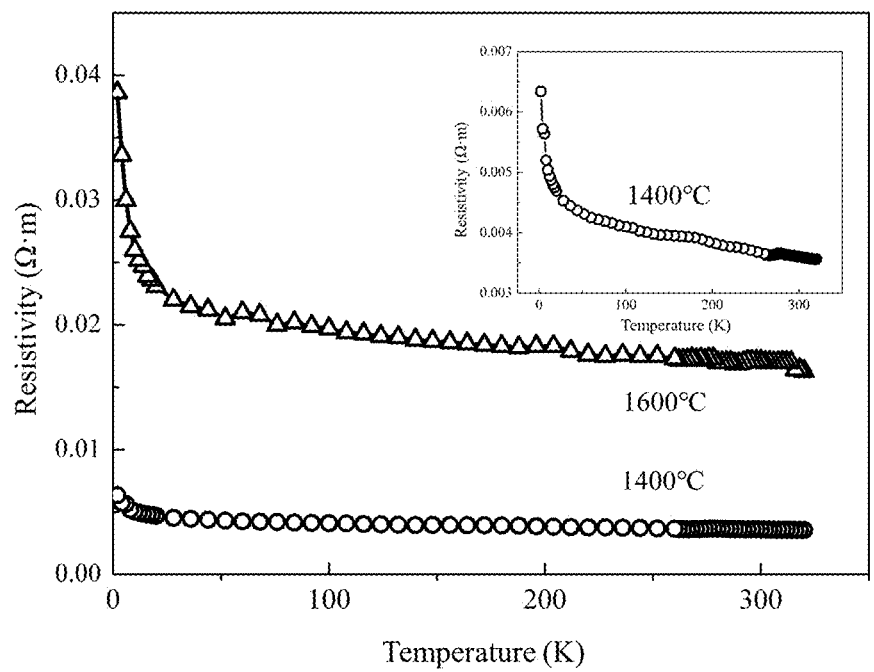
FIG. 8 shows the electrical resistivity vs. temperature profiles of Gradia samples prepared in accordance with Examples 4 and 5, as measured by Physical Property Measurement System (PPMS).
Figure 9A:
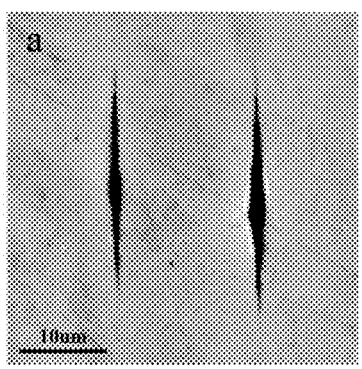
FIG. 9A-FIG. 9C show indentation images of Gradia samples prepared in accordance with Examples 4-6, after a Knoop hardness test, as measured by Atomic Force Microscopy (AFM).

The polished sample of Gradia as obtained was tested by KB-5 BVZ micro-hardness tester to have a Knoop hardness of 65.3±5.3 GPa under 500 g load. The morphology of the indentations formed in the hardness test was observed by Atomic Force Microscope (AFM) and shown in FIG. 9a. Photoluminescence (PL) spectra of the Gradia as prepared were measured by Raman spectrometer and shown in FIG. 7a, with an optical band gap of 1.95 eV. The Gradia as prepared was tested by Physical Property Measurement System (PPMS), showing that the electrical resistivity increases with decreasing temperature (FIG. 8). These test results indicate that Gradia is an ultra-hard semiconducting bulk material with low electrical resistivity.

Example 5: Preparation of Gradia Using $sp^2$ Hybrid Graphite as Raw Carbon Materials The steps (1)-(4) of Example 4 were repeated except that the synthesis temperature in step (3) was set to 1600° C.

The resulting product was measured and analyzed through hard X-ray micro-focusing beamline (BL15U1) from Shanghai Synchrotron Radiation Facility (SSRF), LabRAM HREvolution Raman spectrometer from Horiba JY, France, and Themis Z transmission electron microscope. The measurement results are similar to that of Example 4. The synchrotron XRD result demonstrates that the synthesized Gradia is a carbon allotrope having a new structure; and the results from EELS and Raman spectra demonstrate that it is an $sp^2$-$sp^3$ hybrid carbon.

Figure 9B:
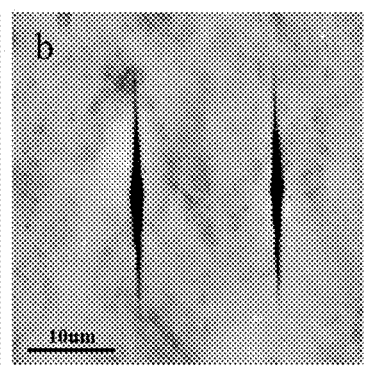

The Gradia as obtained was tested by KB-5 BVZ micro-hardness tester to have a Knoop hardness of 81.3±3.5 GPa under 500 g load. The morphology of the indentations formed in the hardness test was observed by Atomic Force Microscope (AFM) and shown in FIG. 9b. Photoluminescence (PL) spectra of the Gradia as prepared were measured by Raman spectrometer and shown in FIG. 7b, with an optical band gap of 2.02 eV. The Gradia as prepared was tested by Physical Property Measurement System (PPMS), showing that the electrical resistivity increases with decreasing temperature (FIG. 8). These test results indicate that Gradia is an ultra-hard semiconducting bulk material with low electrical resistivity.

Example 6: Preparation of Gradia Using $sp^2$ Hybrid Graphite as Raw Carbon Materials The steps (1)-(4) of Example 4 were repeated except that the pre-sintering pressure and the pre-sintering temperature were set to 50 MPa and 1400° C., respectively in step (1) and the synthesis temperature was set to 2100° C. in step (3).

The resulting product was measured and analyzed through hard X-ray micro-focusing beamline (BL15U1) from Shanghai Synchrotron Radiation Facility (SSRF), LabRAM HREvolution Raman spectrometer from Horiba JY, France, and Themis Z transmission electron microscope. The measurement results are similar to that of Example 4. The synchrotron XRD result demonstrates that the synthesized Gradia is a carbon allotrope having a new structure; and the results from EELS and Raman spectra demonstrate that it is an $sp^2$-$sp^3$ hybrid carbon.

Figure 9C:
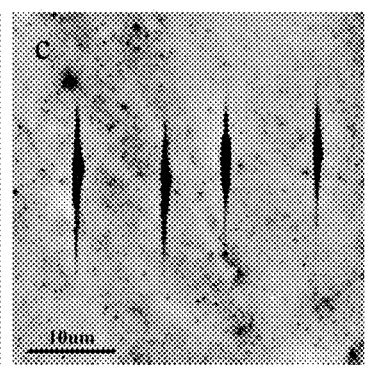

The Gradia as obtained was tested by KB-5 BVZ micro-hardness tester to have a Knoop hardness of 192.1±19.3 GPa under 500 g load. The morphology of the indentations formed in the hardness test was observed by Atomic Force Microscope (AFM) and shown in FIG. 9c.

Certain embodiments are described herein, including preferred embodiments known to the inventors, but the scope of the present disclosure is not limited to these embodiments. Of course, equivalent variations on these described embodiments based on structure, shape, principle and the like will become apparent to those of ordinary skill in the art upon reading the foregoing description and will be covered by the scope of the attached claims.

The present disclosure enumerates alternative materials for each component. It is to be understood that the recited list serves only as a representative group and should not be interpreted as an exclusive list. Other materials not mentioned in the disclosure may be used for achieving the purpose of the present disclosure. The embodiments disclosed herein are illustrative of the principles of the embodiments. Thus, by way of example, but not of limitation, alternative embodiments may be utilized in accordance with the teachings herein.

In addition, every point or individual value may serve as its own lower or upper limit combined with any other point or individual value or any other lower or upper limit, to recite a range not explicitly recited, which range will be covered by the protection scope of the attached claims. Moreover, any combination of the above-described elements in all possible variations thereof is contemplated as falling into the protection scope of the attached claims.

The invention claimed is:

1. An $sp^2$-$sp^3$ hybrid crystalline carbon allotrope, wherein its basic structural unit is composed of $sp^2$ hybrid graphite-like structural unit and $sp^3$ hybrid diamond-like structural unit connected via a coherent interface.

2. The $sp^2$-$sp^3$ hybrid crystalline carbon allotrope of claim 1, which has a space group of 10 (P2/m) or 11 ($P2_1$/m) or 12 (C2/m).

3. A process for the preparation of the $sp^2$-$sp^3$ hybrid crystalline carbon allotrope as defined in claim 1, comprising the steps of:
   (1) Loading raw carbon materials into a pre-pressing mold, pre-forming the raw carbon materials into a body by using a press, and then placing it in a vacuum hot-pressing sintering furnace for pre-sintering;
   (2) Putting the pre-sintered carbon raw material body as obtained in step (1) into an assembly block, and then putting the assembly block containing the carbon raw material body into a drying box for drying;
   (3) Removing the assembly block as obtained in step (2) from the drying box and cooling it, placing it in a press for high temperature and high pressure treatment, and then carrying out pressure relief operation after cooling;
   (4) Removing the assembly block from the press to obtain the $sp^2$-$sp^3$ hybrid crystalline carbon allotrope.

4. The process for the preparation of the $sp^2$-$sp^3$ hybrid crystalline carbon allotrope as claimed in claim 3, wherein the assembly block is cooled to room temperature in step (3).

5. The process for the preparation of the $sp^2$-$sp^3$ hybrid crystalline carbon allotrope as claimed in claim 3, wherein the raw carbon materials comprise any one or several $sp^2$ hybrid carbons selected from the group consisting of graphite, fullerene $C_{60}$, graphene, carbon nanotubes, glassy carbon, amorphous carbon, onion carbon, carbon black, carbine carbon, graphyne, DLC and other carbon materials containing $sp^2$ hybridization.

6. The process for the preparation of the $sp^2$-$sp^3$ hybrid crystalline carbon allotrope as claimed in claim 3, wherein the pre-sintering step of step (1) is carried out at a temperature of 400-1800° C. for a period of 10-60 min.

7. The process for the preparation of the $sp^2$-$sp^3$ hybrid crystalline carbon allotrope as claimed in claim 3, wherein the pre-formed body of step (1) is a cylinder.

8. The process for the preparation of the $sp^2$-$sp^3$ hybrid crystalline carbon allotrope as claimed in claim 3, wherein the drying step of step (2) is carried out at a temperature of 100-250° C. for 1-3 h.

9. The process for the preparation of the $sp^2$-$sp^3$ hybrid crystalline carbon allotrope as claimed in claim 3, wherein the high temperature and high pressure treatment of step (3) is carried out at a pressure of 5-25 GPa and a temperature of 25-2500° C. for a holding period of 5-120 minutes.

10. The process for the preparation of the $sp^2$-$sp^3$ hybrid crystalline carbon allotrope as claimed in claim 3, wherein the $sp^2$-$sp^3$ hybrid crystalline carbon has a crystalline structure that may vary with the changes of the widths or crystallographic orientation relationships of the internal $sp^2$-hybrid graphite-like structural unit and the $sp^3$-hybrid diamond-like structural unit.

11. The process for the preparation of the $sp^2$-$sp^3$ hybrid crystalline carbon allotrope as claimed in claim 3, wherein in step (1) the carbon materials are first subjected to purification by an acid solution to remove impurities and then are cleaned and dried before being loaded into the pre-pressing mold.

12. The process for the preparation of the $sp^2$-$sp^3$ hybrid crystalline carbon allotrope as claimed in claim 3, wherein the raw carbon materials comprise any one or several $sp^2$ hybrid carbons, and wherein the high temperature and high pressure treatment of step (3) is carried out at a pressure of 5-25 GPa and a temperature of 25-2500° C. for a holding period of 5-120 minutes.

13. A cutting tool comprising the $sp^2$-$sp^3$ hybrid crystalline carbon allotrope as defined in claim 1.

14. A grinding tool comprising the $sp^2$-$sp^3$ hybrid crystalline carbon allotrope as defined in claim 1.

15. A semiconductor device comprising the $sp^2$-$sp^3$ hybrid crystalline carbon allotrope as defined in claim 1.

* * * * *